United States Patent
Nakamura et al.

(10) Patent No.: US 7,690,910 B2
(45) Date of Patent: Apr. 6, 2010

(54) MOLD FOR IMPRINT, PROCESS FOR PRODUCING MINUTE STRUCTURE USING THE MOLD, AND PROCESS FOR PRODUCING THE MOLD

(75) Inventors: Takashi Nakamura, Yokohama (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 459 days.

(21) Appl. No.: 11/627,022

(22) Filed: Jan. 25, 2007

(65) Prior Publication Data

US 2007/0176320 A1      Aug. 2, 2007

(30) Foreign Application Priority Data

Feb. 1, 2006      (JP)      .............................. 2006-024180

(51) Int. Cl.
*A01J 21/00*      (2006.01)
(52) U.S. Cl. ...................................... 425/385
(58) Field of Classification Search ................ 425/458, 425/385; 249/60
See application file for complete search history.

(56) References Cited

U.S. PATENT DOCUMENTS 6,869,557 B1 *   3/2005   Wago et al. ................. 264/293
2005/0067379 A1 *   3/2005   Sreenivasan et al. .......... 216/44
2006/0266244 A1 *   11/2006   Kruijt-Stegeman et al. .. 101/485
2007/0023692 A1 *   2/2007   Stenger .................... 250/492.2
2007/0054097 A1    3/2007   Suehira et al.
2007/0090574 A1    4/2007   Terasaki et al.

FOREIGN PATENT DOCUMENTS

JP      2001-85501 A       3/2001

OTHER PUBLICATIONS

Stephen Y. Chou et. al., "Imprint of Sub-25 nm Vias and Trenches in Polymers," 67(21) Appl. Phys. Lett. 3114-16 (1995).
S.Y. Chou et al, "Imprint Lithography with 25-Nanometer Resolution", 272 Science 85-87 (Apr. 1996).

* cited by examiner

*Primary Examiner*—Joseph S Del Sole
*Assistant Examiner*—Jeremiah Smith
(74) *Attorney, Agent, or Firm*—Fitzpatrick, Cella, Harper & Scinto (57) ABSTRACT

A mold for imprint capable of forming a reduced seam or seamless pattern, on a surface of a substrate, having larger area than that of the mold includes a first pattern area comprising a plurality of first recesses; and a second pattern area, comprising a plurality of second recesses, for being used as an alignment mark. The first pattern area and the second pattern area have an equal height at their outermost surfaces. The first recesses and the second recesses have different depths. The first pattern area and the second pattern area have an equal cyclic interval.

8 Claims, 8 Drawing Sheets

MOLD FOR IMPRINT, PROCESS FOR PRODUCING MINUTE STRUCTURE USING THE MOLD, AND PROCESS FOR PRODUCING THE MOLD

FIELD OF THE INVENTION AND RELATED ART

The present invention relates to a mold for imprint, a production process of a minute structure using the mold, and a production process of the mold. Particularly, the present invention relates to a mold for imprint capable of forming a structure having a larger area than that of the mold at a surface of a substrate, a production process of a minute structure using the mold, and a production process of the mold.

As a representative embodiment of a preparation process of a minute structure, there has been known a photolithographic process. According to this process, it is possible to form a fine (minute) pattern of 100 nm or less by using an ArF excimer laser as a light source. Further, in recent years, as a method of forming a finer pattern, exposure processes using extreme ultraviolet (EUV) rays, X-rays, electron rays, or the like have been studied.

However, in these preparation processes, photolithography not only includes a long and complicated process, but also requires the use of an expensive apparatus to form the fine pattern. For this reason, as one of techniques in place of these preparation processes, a nanoimprint method has been studied as described in S. Y. Chou et al., Science, Vol. 272, pp. 85-87, Apr. 5 (1996).

In the nanoimprint method, a mold having projections and recesses corresponding to a structure to be prepared is prepared and pressed against a substrate to form the projections and recesses at a surface of the substrate and on the basis of the thus formed projections and recesses, the structure is prepared. According to this method, it is possible to prepare a minute structure by a simple process using an inexpensive apparatus.

As the mold for use in the nanoimprint method, for example, those formed of SiC, SiO$_2$, quartz, and the like by a lithographic process have been reported.

As an applied embodiment of the nanoimprint method, there is formation of a starting point of anodic oxidation in addition to formation of a wiring.

It has been known that aluminum is subjected to the anodic oxidation to form small holes perpendicular to a substrate surface. In the case of the nanoimprint method, it is possible to regularly arrange the small holes by effecting the anodic oxidation after regularly forming a recess pattern at the substrate surface as a starting point. In this case, it is possible to form the recess pattern by pressing a mold having a projection structure against the substrate.

In order to effect high accuracy processing by the nanoimprint method, it is necessary to effect alignment of the mold with the substrate with high accuracy.

Figure 8:
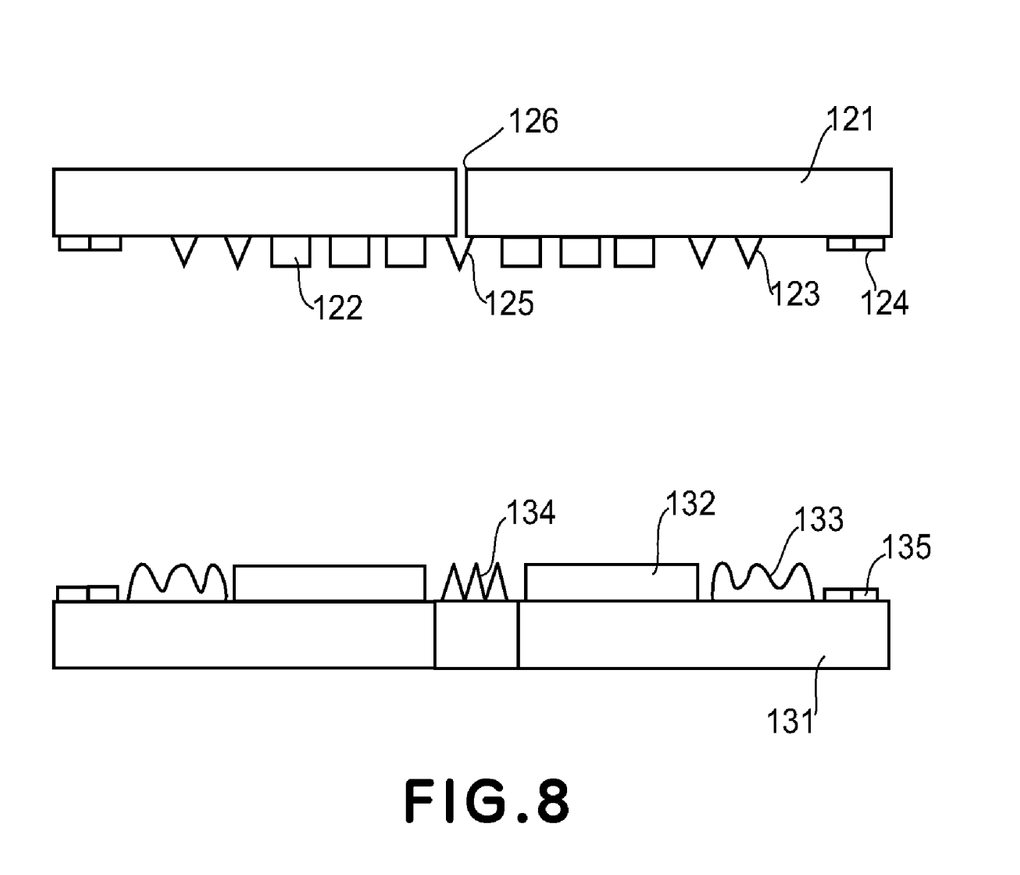
FIG. 8 includes schematic views for illustrating a conventional mold and an alignment method using the mold.

As a method of aligning the mold with the substrate, for example, Japanese Laid-Open Patent Application (JP-A), No. 2001-85501 has proposed a method in which a relative position is optically detected by optical interferometry using alignment marks formed with respect to both of the mold and the substrate as shown in FIG. 8.

More specifically, referring to FIG. 8, a mask (mold) 121 is provided with a projection recess portion 122 for transferring a pattern, a projection portion 123 for self alignment, a mark 124 for roughly effecting optically positional alignment, and a metal-made STM (scanning tunneling microscope) probe 125 at a central portion of the mask. On the other hand, on a substrate 131, a coating film 132 of polymethyl methacrylate, a projection recess portion 133 for self alignment, three metal-made probes 134 which correspond to the STM probe 125 and are used for permitting nanometer control at a central portion of the substrate, and a mark 135 for roughly effecting optically positional alignment, are provided.

In such a constitution, first, the mask 121 and the mold 131 are aligned so that the mark 124 and the mark 135 are aligned with each other by using an optical microscope. Next, the mask 121 and the mold 131 are disposed so that the projection/recess portions 123 and 133 for self alignment are engaged with each other. Then, (positional) alignment is effected by measuring positions of three metal probes 134 by means of the STM probe 125 to move the STM probe 125 so as to face a center probe of the three metal probes 134.

The mold for use in imprint requires much time and cost for preparing the mold as a pattern, to be transferred onto a member to be processed. Also, a processing surface of the mold has to have a larger size. As one of the methods for solving such a problem, a method is employed in which repetitive pressing is effected while changing a relative position between the mold and the substrate as the member to be processed. As a result, it is possible to form a pattern having a larger area than that of the mold at the surface of the substrate.

However, in the alignment method of JP-A 2001-85501, at both end portions of the mold (mask), the projection portion 123 for self alignment and the mark 124 for the positional alignment are provided. Accordingly, at these portions, the projection/recess portion as a pattern to be transferred onto the member to be processed cannot be formed, so that no pattern area is formed.

For this reason, in the case of using the method in which the repetitive pressing is effected while changing the relative position between the mold and the substrate, it is difficult to prepare a seamless pattern having a larger area than that of the mold at the substrate surface.

SUMMARY OF THE INVENTION

In view of the above-described problem, a principal object of the present invention is to provide a mold for imprint capable of forming a pattern having a larger area than that of the mold at a surface of a substrate.

Another object of the present invention is to provide a process for producing a minute structure using the mold and a process for producing the mold.

According to an aspect of the present invention, there is provided a mold for imprint, comprising:

a first pattern area comprising a plurality of first recesses; and a second pattern area, comprising a plurality of second recesses, for being used as an alignment mark, wherein the first pattern area and the second pattern area have an equal height at their outermost surfaces, wherein the first recesses and the second recesses have different depths, and wherein the first pattern area and the second pattern area have an equal cyclic interval.

According to another aspect of the present invention, there is provided a mold for imprint, comprising:

a first pattern having a projection and recess shape for being transferred onto a member to be processed; and a second pattern having a projection and recess shape for being used as an alignment mark, wherein the projection and recess shape of the second pattern has a height different from that of the projection and recess shape of the first pattern and has a cyclic interval equal to that of the projection and recess shape of the first pattern.

According to another aspect of the present invention, there is provided a mold for imprint, comprising:

a first pattern, provided at a surface of the mold, having a projection and recess shape for being transferred onto a member to be processed; and a second pattern, provided at a surface of the mold, for being used as an alignment mark, wherein the second pattern is formed in one or more plane parallel to and different in height from a plane in which the first pattern is formed, and wherein as at least a part of the second pattern, a pattern having the same projection and recess shape as that of the first pattern is formed.

In a preferred embodiment, at least a part of the first pattern area is arranged with a constant cyclic interval. Further, at least a part of the first pattern area may preferably be a projection.

In a preferred embodiment, the second pattern area is optically observable. Further, the second pattern area may preferably be formed at a corner portion of the mold. Further, the second pattern area may preferably include a projection and recess pattern at a portion thereof, and the projection and recess pattern may preferably have a depth smaller than that of the first pattern area. Further, the second pattern area may preferably be formed in two planes parallel to and higher and lower than a plane in which the first pattern area is formed.

In a preferred embodiment, the mold comprises a light-transmissive material.

According to a further aspect of the present invention, there is provided a process for producing a minute structure for transferring a pattern formed at a processing surface of a first pattern of a mold onto a surface of a member to be processed by effecting pressing from at least one side of the mold and the member to be processed, the process comprising:

a first step for forming an optically recognizable third pattern at the surface of the member to be processed by transferring the first pattern and a second pattern of the mold onto the surface of the member to be processed by means of any one of the above described molds for imprints;

a second step for transferring again the first pattern and second patterns of the mold onto the surface of the member to be processed by effecting alignment using the second pattern of the mold and the third pattern of the member to be processed after a relative position between the mold and the member to be processed is changed; and a third step for forming a seamless continuous pattern by repeating the second step. In a preferred embodiment of the production process, in the second step, the alignment is effected so that a pattern, of the mold, identical to the third pattern formed on the member to be processed overlaps with the third pattern.

In a preferred embodiment of the production process of the minute structure, a substrate comprising Al or an Al alloy as at least a part thereof is used as the member to be processed in the first step, and after the third step, a minute (fine) hole structure having regularly arranged small holes is formed at least at a portion of the substrate by anodic oxidation.

According to a further aspect of the present invention, there is provided a process for producing any one of the above described molds for imprint, comprising:

a step of forming a pattern corresponding to a first pattern of the mold on a substrate for the mold by dry etching;

a step of forming a resist pattern corresponding to a second pattern for being used as an alignment mark of the mold by coating a resist at a surface of the substrate on which the pattern is formed; and a step of forming an optically recognizable pattern, having a smaller depth than that of the first pattern, as the second pattern for being used as the alignment mark of the mold while forming the first pattern of the mold, by effecting dry etching of the substrate for the mold having the resist pattern.

According to a further aspect of the present invention, there is provided a process for producing any one of the above described molds for imprint, comprising:

a step of forming alumina nanoholes by effecting anodic oxidation of a layer of Al or Al alloy formed on a substrate;

a step of filling a metal material in the alumina nanoholes by plating, coating a resist at a surface of the substrate, forming an opening only at a portion to be used as an alignment mark, and removing a part of exposed alumina; and a step of effecting electroplating or electroless plating in the alumina nanoholes to increase a thickness of plating material and separating only a resulting plating portion to prepare a mold for imprint having a second pattern used as an alignment mark.

According to a still further aspect of the present invention, there is provided a process for producing a member having an imprint pattern, comprising:

oppositely disposing a substrate having a member to be processed and a mold having a first pattern for forming an imprint pattern to be transferred onto the member to be processed and a second pattern to be utilized as an alignment mark;

simultaneously transferring the first pattern and second pattern of the mold onto the member to be processed; and forming an imprint pattern on a surface of a substrate by utilizing projections and recesses formed on the member to be processed by the first pattern and the second pattern.

In a preferred embodiment of the production process of the member having the imprint pattern, the first pattern has projections and recesses which are different in height and the same cyclic interval as those of the second pattern. Further, by either one of the production processes of the member having the imprint pattern, the resultant member having a seamless imprint pattern is produced on the basis of the imprint pattern of the mold.

According to the present invention, by repetitively effecting pressing while changing a relative position between the mold and the substrate, it is possible to form a pattern having an area larger than that of the mold at a surface of the substrate with a reduced or no seam area caused by an alignment mark provided to the mold.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1(a) and 1(b) are schematic views showing a constitution of a mold as an embodiment of the present invention, wherein FIG. 1(a) is a plan view of the mold and FIG. 1(b) is a sectional view taken along X-X' line shown in FIG. 1(a).

DESCRIPTION OF THE PREFERRED EMBODIMENTS

Hereinbelow, embodiments of the present invention will be described with reference to the drawings.

Figure 1:
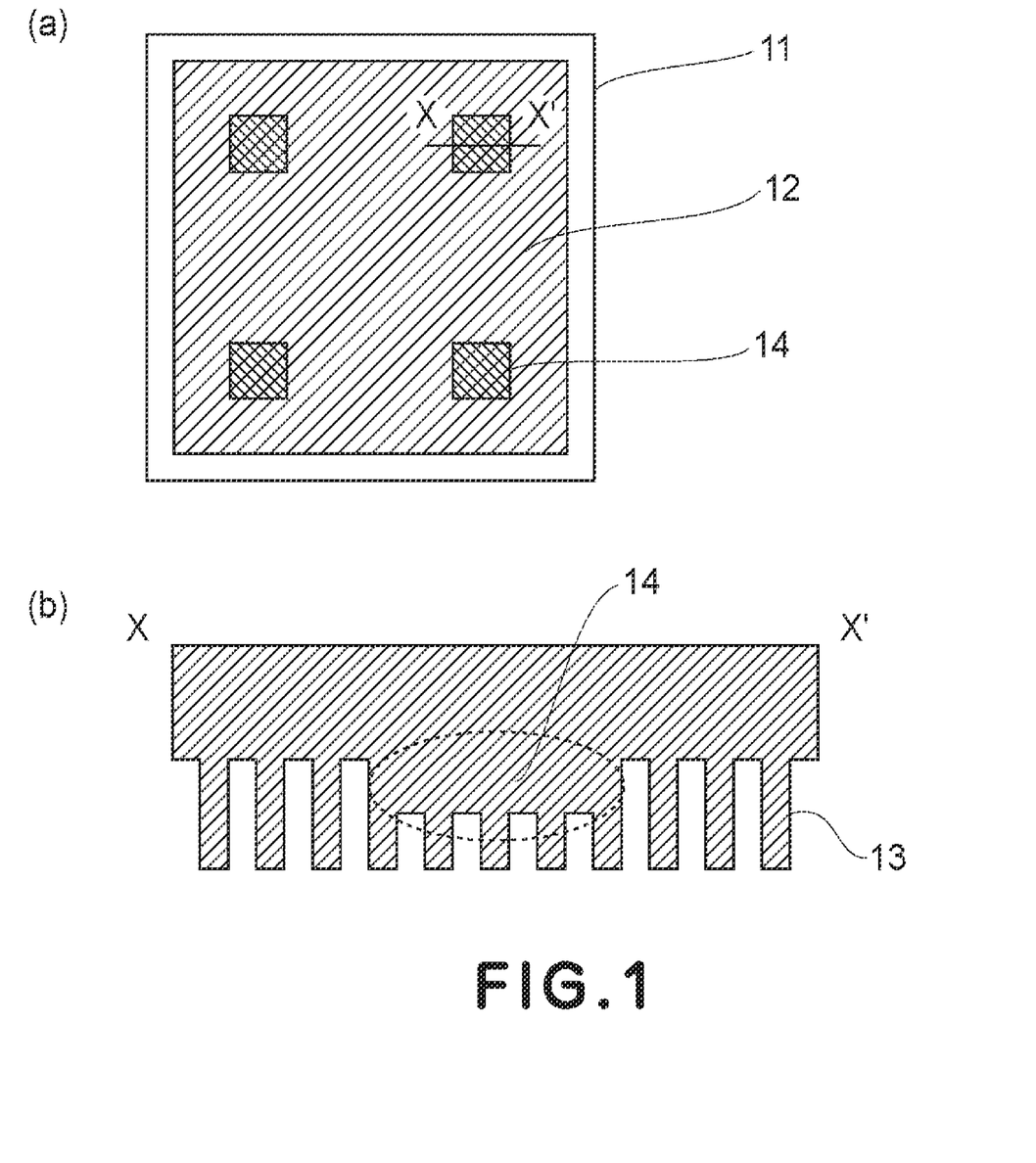

FIGS. 1(a) and 1(b) shows a constitution of a mold according to an embodiment of the present invention, wherein FIG. 1(a) is a plan view of the mold and FIG. 1(b) is a sectional view taken along X-X' line shown in FIG. 1(a).

Referring to these figures, a mold 11 is provided with a pattern A forming area 12, a pattern A(13), and a pattern B(14).

The pattern A(13) is projection/recess pattern (imprint pattern) for effecting patterning through a nanoimprint method and is formed in the same plane at an outermost surface of the mold 11.

The pattern B(14) is a pattern to be used as an alignment mark which is constituted so that it is optically recognizable. The pattern B(14) is formed in a pattern, different from that in which the pattern A(13) is formed, close to corners of the mold 11.

At least at a part of the pattern B(14), the same projection/recess (imprint pattern) as that of the pattern A(13) is formed in a depth different from that of the pattern A(13). As a result, the mold 11 is provided with the imprint patterns constituted by the patterns A(13) and B(14), different in height (depth), for being transferred onto a surface of a substrate as a member to be processed.

Incidentally, in FIG. 1(b), the pattern B(14) has a recess structure having a depth smaller than that of other portions with no pattern B(14) but may also be formed so that it has a depth larger than that of the other portions. Further, in FIG. 1(b), the pattern B(14) is formed in the same plane but may also be formed in a plurality of planes.

As a material for the mold, it is possible to use Si, $SiO_2$, SiN, glass, quartz, ceramic, metals, and oxides. These materials may be used singly or in mixture containing at least one species of these materials. Examples of the metals and the oxides may include Au, Pt, Ag, Pd, Cu, Ni, Co, alloys of these metals, and oxides of these metals.

In order to effect pressing using the mold after the alignment, the mold may preferably be transparent, particularly be formed of quartz.

Pattern formation is effected by pressing with respect to a resin-coated substrate. As a material for the substrate on which the resin material is coated, it is preferable that Si, glass, plastic, carbon, or metal such as Al is used.

In the case of a substrate of Al, plating with NiP may preferably be effected in order to enhance hardness of the substrate. However, the substrate usable in the present invention is not limited thereto but may be any substrate so long as it has such a strength that it does not deform during the pressing and such smoothness that it has a height or depth smaller than that of the imprint (projection/recess) structure of the mold. Further, in the case of using a sufficiently thick resin layer, a substrate may also be omitted.

Examples of the resin material to be pressed may include thermoplastic resins, such as polyethylene, polycarbonate, polypropylene, polyvinyl alcohol, polyvinylidene chloride, polyethylene, terephthalate, polyvinyl chloride, polystyrene, and acrylic resin; thermosetting resins, such as epoxy resin, phenolic resin, and melamine resin; and various resists. These materials may be used singly or as a mixture of two or more species.

Figure 2:
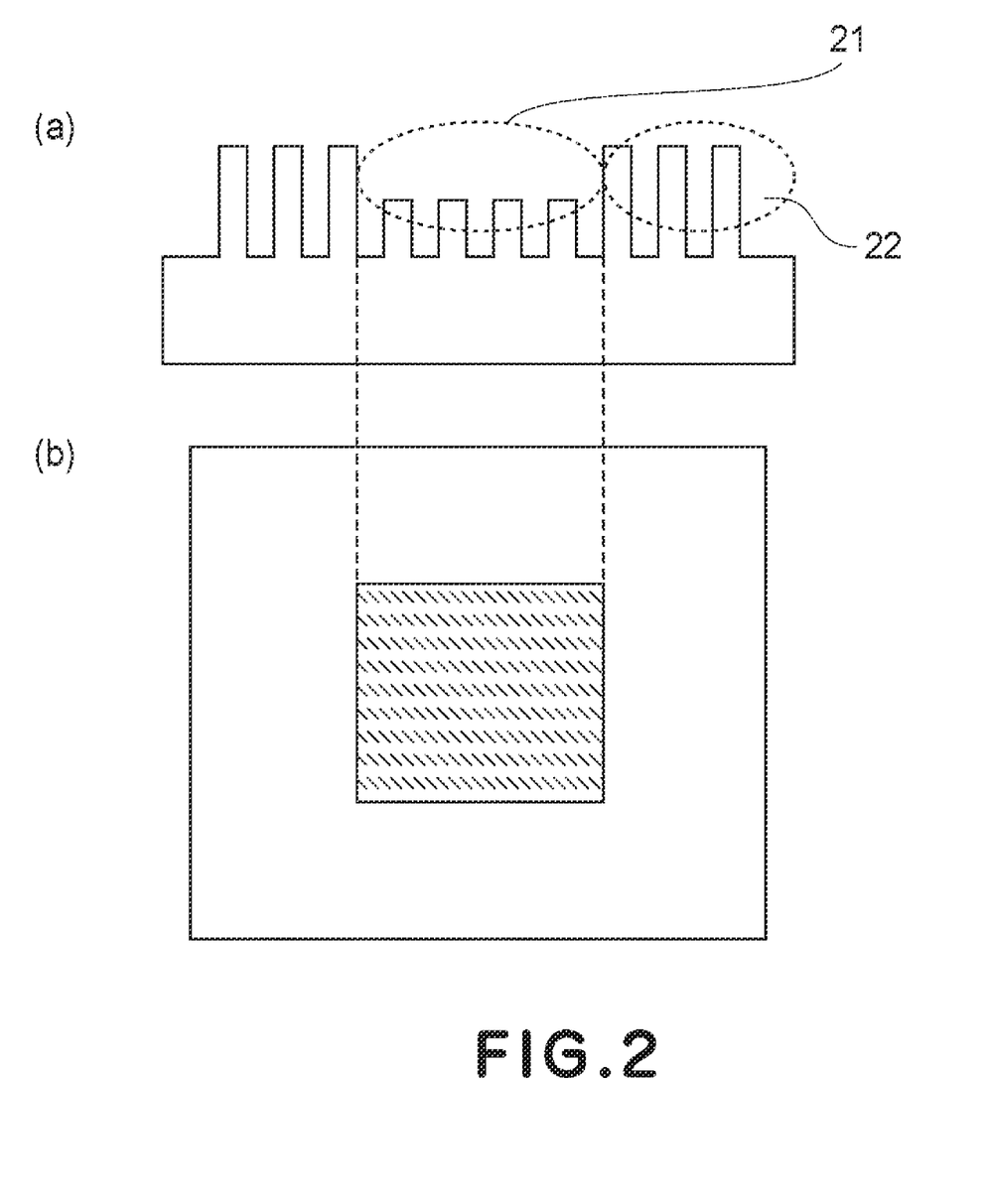
FIGS. 2(a) and 2(b) are schematic views showing a pattern formed at a surface of a substrate by nanoimprint method using the mold of the embodiment of the present invention shown in FIG. 1.

FIGS. 2(a) and 2(b) show a pattern formed on the substrate surface by the nanoimprint method using the mold 11 shown in FIGS. 1(a) and 1(b).

Referring to FIGS. 2(a) and 2(b), the substrate surface has a pattern C(21) formed in an area to which the pattern B(14) of the mold 11 is transferred and a pattern D(22) formed in an area to which the pattern A(13) is transferred. As shown in these figures, the pattern C(21) has an imprint pattern having a height lower than that of the pattern D(22), so that the pattern C(21) is optically recognizable.

Accordingly, by using an image-pickup system with high magnification, it is possible to effect (positional) alignment of the pattern B(14), as the alignment mark provided to the mold, with the pattern C(21) formed on the substrate by the pressing.

During the alignment, in the case where at least one of the mold and the substrate has optical transparency, it is possible to effect alignment of the substrate and the mold while reading the pattern B(14) and the pattern C(21) by means of a camera in such a state that the alignment marks provided to both of the substrate and the mold overlap with each other. However, both of the materials for the mold and the substrate may also have no optical transparency. In this case, before the alignment, the alignment marks of the mold and the substrate may be recognized by different cameras, respectively, and then the alignment may be effected.

In the present invention, the pressing is effected in such a manner that a first pressing operation is performed with respect to the substrate or the resin material on the substrate and then a second pressing operation is performed after the pressing position is shifted. During the second pressing operation, projections and recesses formed by the first pressing operation are used for alignment in the second pressing operation.

The mold is provided with projections and recesses for pattern formation (corresponding to an imprint pattern to be originally formed on the substrate) and those for alignment mark in mixture. For example, it is possible to employ a constitution in which the projections and recesses for pattern formation may be provided so as to surround the projections and recesses for alignment mark and vice versa.

In the present invention, it is important that projection and recesses transferred onto the substrate or the resin material on the substrate by those for alignment mark are also used for pattern formation with respect to the substrate.

Figure 3:
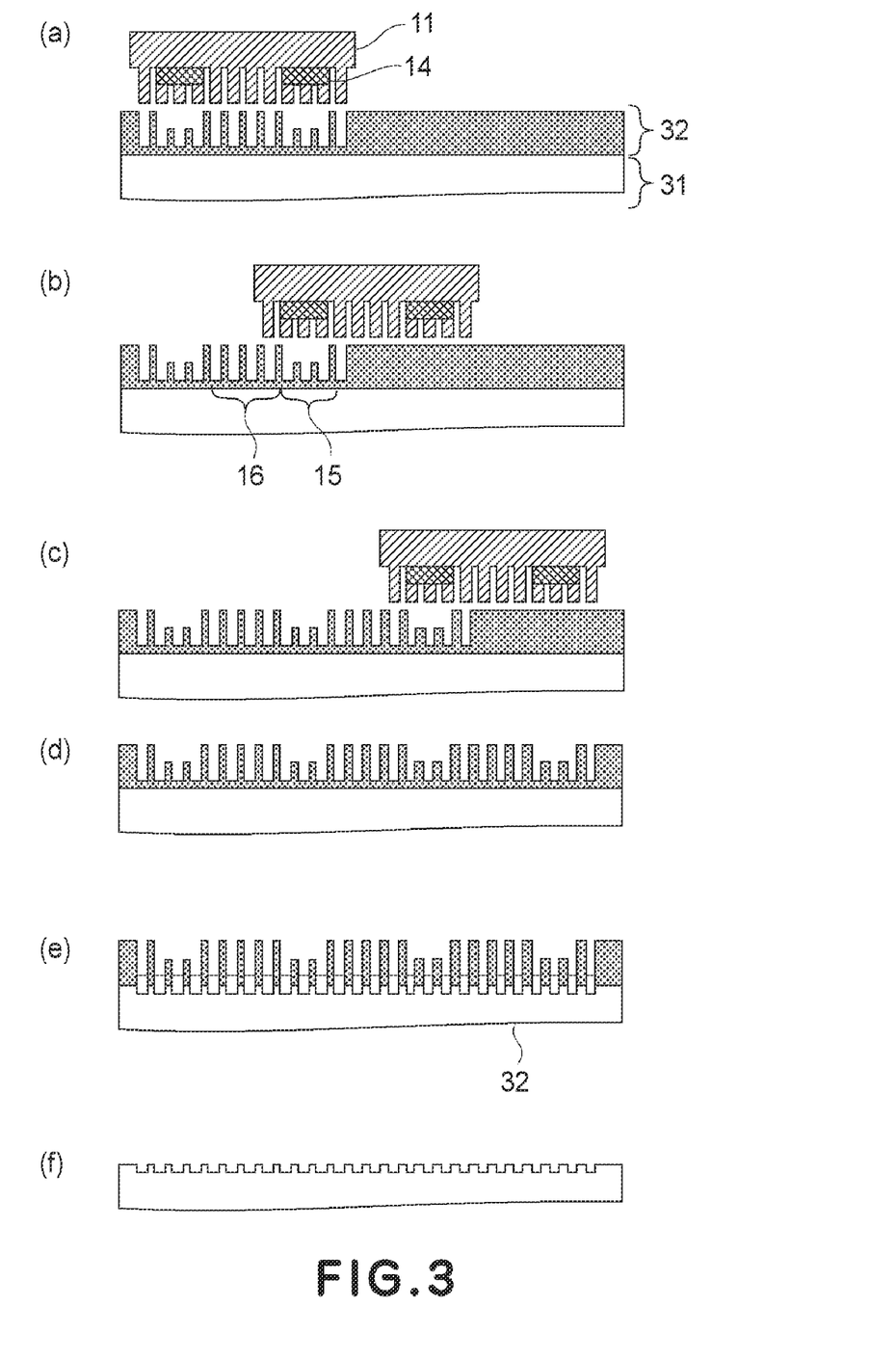
FIGS. 3(a) to 3(f) are schematic views for illustrating an alignment method of a mold with a substrate in an embodiment of the present invention.

Further, by providing the projections and recesses for pattern formation and those for alignment mark with the same interval as shown in FIGS. 3(a) to 3(c), it is possible to realize a projection/recess shape with substantially no seam of pattern or a projection/recess shape with a reduced seam area, compared with the case where the projection/recess pattern is not formed at an outer peripheral portion of a mold but only an alignment mark is formed at the portion as in a conventional mold, even when there is a slight seam. In this embodiment, portions where the pressing is repetitively performed two times and portions where the repetitive pressing is not performed are present in mixture. In some cases, due to a difference in number of pressing operations, a resultant shape can be changed slightly.

Incidentally, the projections and recesses for pattern formation and those for alignment mark may preferably have the same interval but may also have different intervals as desired.

Next, an alignment method of the mold with the substrate in this embodiment will be described.

FIGS. 3(a) to 3(f) are schematic views for illustrating the alignment method of the mold with the substrate during the nanoimprint using the above described mold 11.

When the nanoimprint method is performed, first, by effecting pressing with the mold 11 at a position, a projection/recess shape as shown in FIG. 3(a) is formed. Alignment during this pressing operation is effected by utilizing an outer periphery of the substrate but may also be not effected.

Next, a relative position between the mold and the substrate is changed and then alignment is effected by using a pattern D(15) formed on the substrate 31 and the pattern B(14) of the mold 11, followed by the nanoimprint again (FIG. 3(B)). In this case, at a portion of the pattern D(15) and a peripheral portion thereof, patterns formed on the mold and the substrate may also be different from each other.

By repeating the steps shown in FIGS. 3(a) and 3(b), as shown in FIGS. 3(c) and 3(d), the pattern C(21) is formed on the substrate surface as a seamless (continuous) pattern through the nanoimprint performed plural times.

In this manner, the projection/recess pattern is formed on the substrate surface and thereafter etching is effected, followed by removal of resist to obtain a pattern at the surface of the substrate (FIGS. 3(e) and 3(f)).

Next, a production process of the mold in this embodiment will be described.

FIGS. 4(a) to 4(f) are schematic views for illustrating an example of a production process of a mold for nanoimprint provided with alignment mark in this embodiment.

In this production process, as a material for the mold, a quartz substrate 43 having a smooth surface is used.

After a 20 nm-thick Al film (layer) 42 is formed at the surface of the above prepared substrate by sputtering, a resist 41 for electron beam lithography is formed on the Al film 41 by spin coating (FIG. 4(a)).

Next, a desired pattern is formed and developed by an electron beam lithography system to form a patterned resist layer 44 (FIG. 4(b)).

Figure 4:
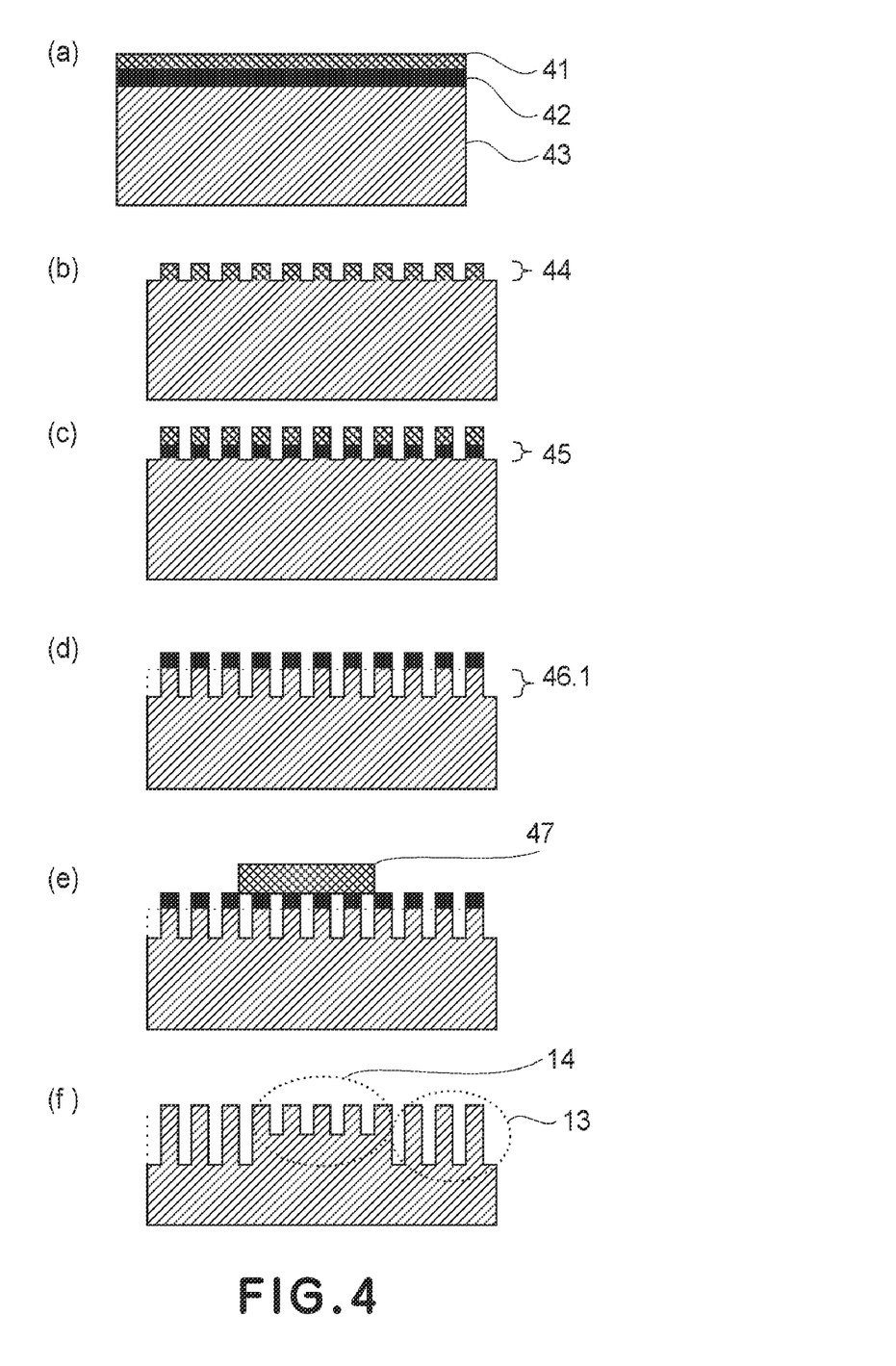
FIGS. 4(a) to 4(f) are schematic views for illustrating an example of a production process of a mold for nanoimprint provided with an alignment mark in an embodiment of the present invention.

Next, a pattern 45 is formed by subjecting the Al film 42 to dry etching (FIG. 4 (c)). By using the resultant structure formed at the quartz substrate surface as an etching mask, a pattern 46 is formed by dry etching (FIG. 4(d)).

Then, the resist is coated again on the thus patterned surface of the substrate, followed by light exposure and development to form a resist pattern 47 having a shape corresponding to an alignment mark (FIG. 4(e)).

Thereafter, the quartz substrate is subjected to dry etching again. At a portion provided with no resist, a pattern A(13) having a height (depth) larger than that of the pattern 46 formed by primary dry etching is formed. Further, immediately under the mask with the resist, a pattern has a smaller depth, so that an optically recognizable pattern B(14) is formed. Thereafter, the resist and the Al film are removed (FIG. 4(f)).

By the above described method, a mold for nanoimprint provided with an alignment mark is obtained.

In this embodiment, it is possible to employ a constitution in which the pattern B formed on the mold in one or more plane which is parallel to and different in height (depth) from a plane in which the pattern A is formed.

Figure 5:
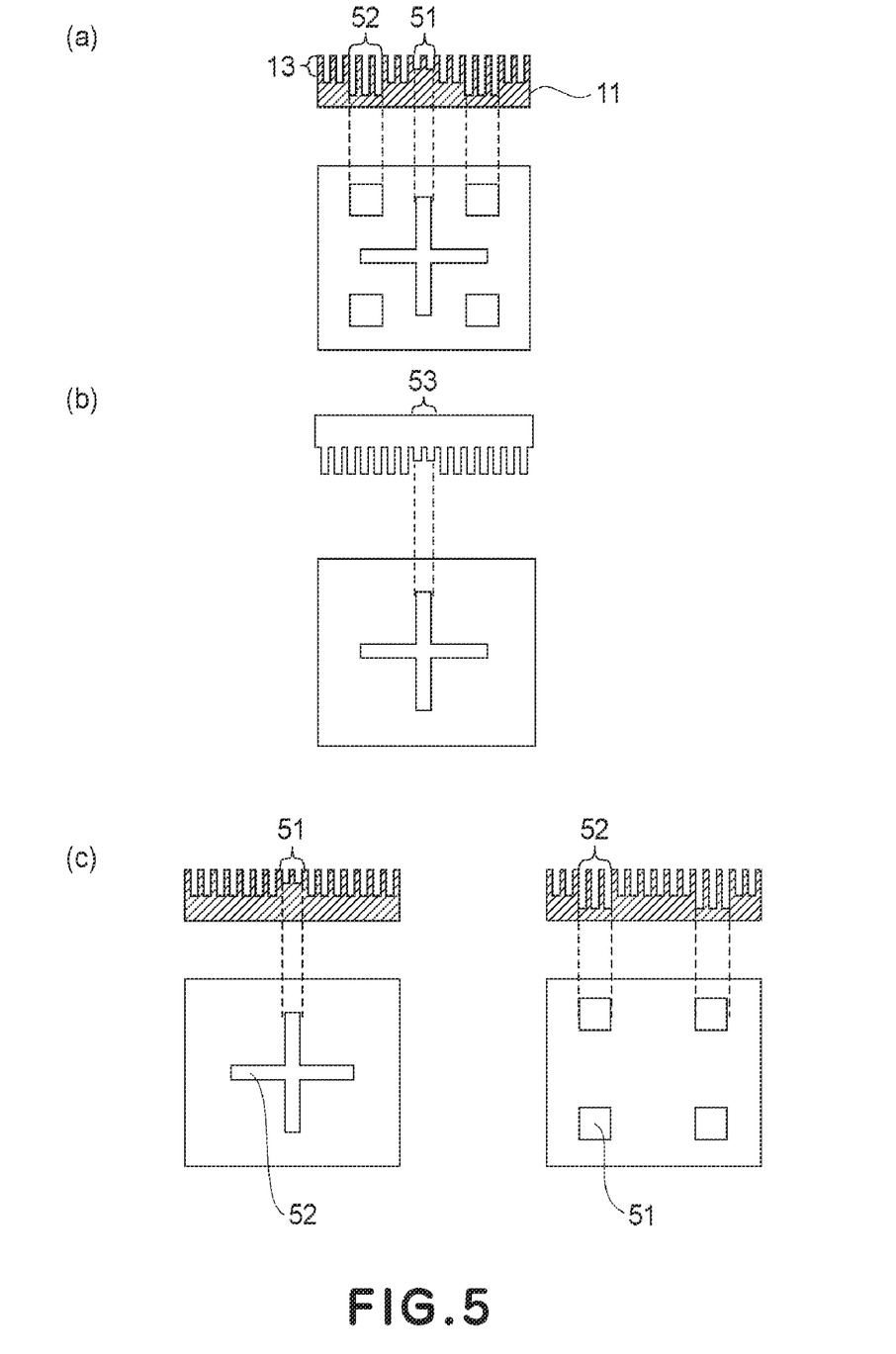
FIGS. 5(a) to 5(c) are schematic views for illustrating a constitutional example of a pattern B formed in one or more plane which is parallel to and different in height (depth) from a plane in which a pattern A is formed in an embodiment of the present invention.

FIGS. 5(a) to 5(c) show an example of a constitution of the pattern B formed in one or more plane which is parallel to and different in height (depth) from a plane in which the pattern A is formed. For example, as shown in FIG. 5(a), the pattern B is constituted two kinds of patterns different in depth which are formed on the mold in addition to the pattern A(13). More specifically, on the basis of a plane of a bottom portion of a recess structure formed for preparing the pattern A(13) as a reference plane, a cross pattern B1(51) formed in a plane of a bottom portion of a recess structure having a smaller depth than that of the recess structure for the pattern A and a rectangular pattern B2(52) formed in a plane of a bottom portion of a recess structure having a larger depth than that of the recess structure for the pattern A are provided.

When the pressing is effected by using the mold 11 provided with the pattern B1 and the pattern B2, the rectangular pattern B2(52) includes a projection/recess pattern having a height (depth) larger than that of the pattern A(13), thus being not transferred. As a result, only the cross pattern B1(51) is transferred onto the substrate (FIG. 5(b))

In this manner, by using the cross pattern B1(51) transferred onto the substrate and the pattern B2(52) formed on the mold, it is possible to effect alignment while changing a relative position between the substrate and the mold.

Incidentally, it is not necessary to form the cross pattern and the rectangular pattern in the same area. For example, as shown in FIG. 5(c), the cross pattern and the rectangular pattern including four squares may be formed in different areas.

Next, a production process of another mold for nanoimprint provided with an alignment mark in this embodiment will be described.

FIGS. 6(a) to 6(f) are schematic views for illustrating a production process of a mold for nanoimprint using anodic-oxidized alumina nanoholes in this embodiment.

In this embodiment, the mold for nanoimprint provided with an alignment mark having projections with the same pitch by using anodic-oxidized alumina nanoholes regularly arranged is prepared.

Figure 6:
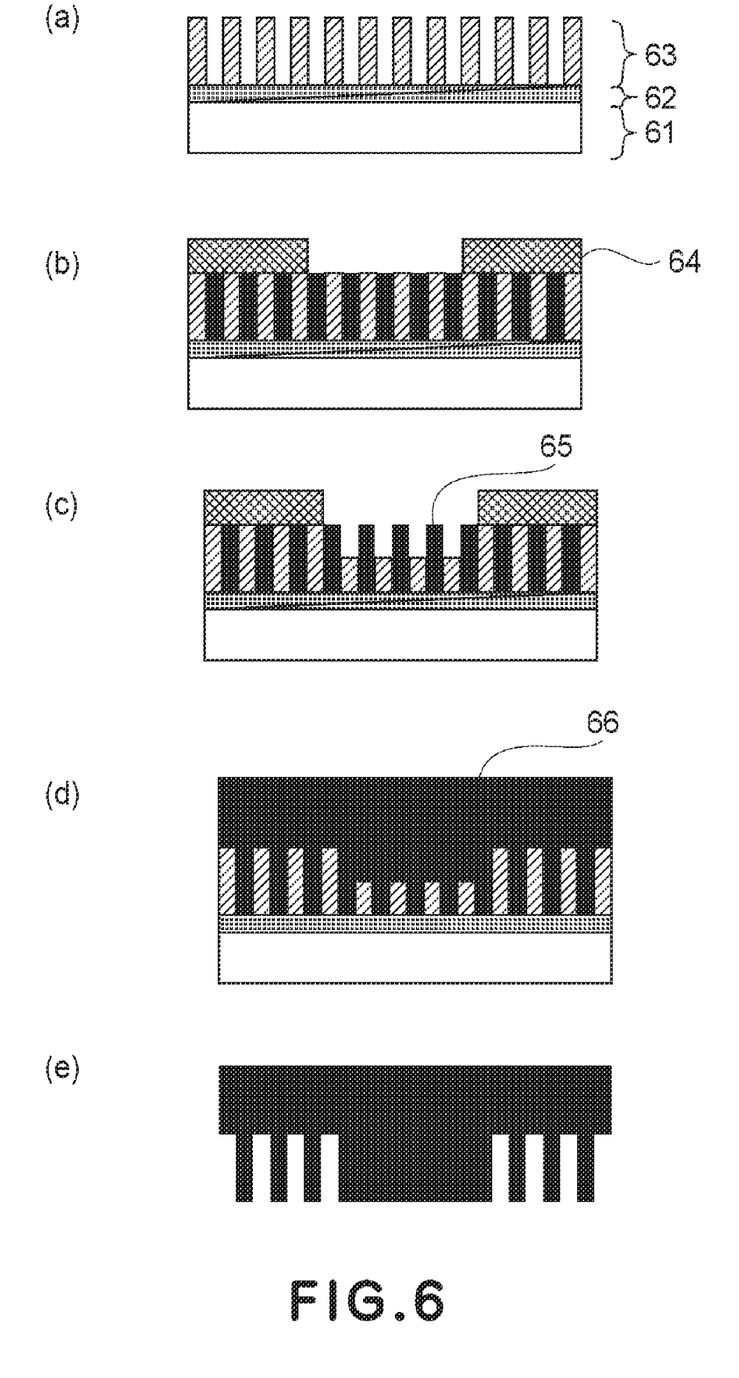
FIGS. 6(a) to 6(e) are schematic views for illustrating a production process of a mold for nanoimprint using anodic-oxidized aluminum holes in an embodiment of the present invention.

As a substrate 61, it is preferable that Si, glass, plastic, carbon, or metal such as Al is used. In the case of the Al substrate, plating with NiP may preferably be effected in order to enhance hardness.

At the surface of the substrate 61, a layer for improving adhesiveness and imparting electroconductivity is formed by sputtering, (vacuum) vapor deposition, or the like, as desired. Herein, such a layer, which is provided between the substrate 61 and an Al or Al alloy layer 63, for improving adhesiveness and imparting electroconductivity is referred to as an underlying layer 62.

On the underlying layer 62, the Al or Al alloy layer 63 is formed by sputtering or vapor deposition. Incidentally, the underlying layer 62 and the Al or Al alloy layer 63 may also be formed by another method.

Next, a recess structure as a starting point of anodic oxidation is formed in the following manner. A resist is coated at the surface of the Al or Al alloy layer to form an opening through photolithography or electron beam lithography, followed by dry etching. Alternatively, after the resist is coated, a recess structure is formed by the nanoimprint method on the resist by using a mold prepared by forming a constant cyclic interval structure at its surface. In these cases, it is also possible to employ a focused ion beam (FIB) method.

Thereafter, alumina nanoholes are formed by anodic oxidation (FIG. 6(a)).

After the nanoholes are formed, metal is filled in the nanoholes by plating as shown in FIG. 6(b). A material for a plating portion 64 may, e.g., be Au, Pt, Ag, Pd, Cu, Ni or Co, alloys of these metals, and oxides of these metals. However, the material is not particularly limited so long as it can be deposited by electroplating or electroless plating.

After the plating, polishing is effected to removing the plating portion outside the nanoholes.

Next, a resist 64 is coated at the surface of the above-treated substrate (FIG. 6(b)). Then, the substrate is subjected to light exposure and development to form an opening only at a portion used as an alignment mark, followed by etching to remove a part of exposed alumina (FIG. 6(c)).

After removing the resist, the substrate is subjected to electroplating or electroless plating to fill the alumina nanoholes and increase the thickness of the plating portion (FIG. 6(d)).

By removing only the plating portion, it is possible to obtain a mold 66 for nanoimprint provided with an alignment mark (FIG. 6(e)).

The production process of the mold is not limited to the above described method but may also be, e.g., a method wherein a substrate of Si or the like is processed by the FIB method.

Hereinafter, the present invention will be described more specifically based on Embodiments but is not limited thereto.

Embodiment 1

In Embodiment 1, a production process of a quartz-mode mold for nanoimprint having an optically recognizable sub-pattern and a production process of a nanostructure using the mold according to the present invention will be described.

In this embodiment, as a substrate for preparing a mold, a 1.2 mm-thick quartz substrate having a 10 mm square area is used.

At the surface of the quartz substrate, a 20 nm-thick layer (film) of Al is formed by sputtering and thereon, a 30 nm-thick resist for electron beam lithography is formed by spin coating.

In a 5 mm square area, a pattern including a constant-pitch slit pattern having a pitch of 200 nm and a width of 100 nm is formed by light exposure and development.

Thereafter, by dry etching, a thin line pattern having a pitch of 200 nm and a width of 100 nm is formed in the Al layer.

Then, by using the Al layers an etching mask, a recess structure having a pitch of 200 nm, a line width of 100 nm, and a depth of 30 nm is formed in the 5 mm square area at the surface of the quartz substrate.

Next, the resist for electron beam lithography is again coated on the quartz substrate surface in a thickness of 100 nm.

Then, each of four corner portions of the 5 mm square area (for pattern formation), a 500 μm square pattern is formed by light exposure and development.

Thereafter, the quartz substrate is subjected to dry etching again to form a slit structure (pattern A) having a pitch of 200 nm, a width of 100 nm, and a depth of 80 nm at a portion other than the masking portion with the resist for electron beam lithography. Further, at the masking portion, a slit structure (pattern B) having a pitch of 200 nm, a width of 100 nm, and a depth of 30 nm is formed.

As a result, a quartz-made mold for nanoimprint including a 200 nm-pitch slit structure and an optically recognizable 500 μm square sub-pattern is prepared.

By using the thus prepared mold, a slit structure is formed at a surface of an Si substrate in the following manner.

On a 4-inch Si wafer, after a 5 nm-thick Ti layer and a 20 nm-Al layer are successively formed by sputtering, a 100 nm-thick resist for electron beam lithography is formed by spin coating.

Thereafter, nanoimprint(ing) is effected with respect to the substrate by using the above prepared mold with the alignment mark under a condition of 150° C. and 1 ton/cm$^2$.

As a result, at the surface of the substrate, a fine pattern is formed in a 5 mm square area.

Next, as shown in FIG. 3(b), a pattern D(15) formed on the substrate by pressing and the pattern B(14) as a mold-side alignment mark are aligned with each other by overlapping each other, followed by pressing.

After repeating the above described pressing operations, dry etching is effected to prepare a slit structure, usable as a mold for nanoimprint, having a pitch of 200 nm, a width of 100 nm, and a depth of 50 nm in a 9.5 mm square area.

Embodiment 2

In Embodiment 2, a production process of a quartz-mode mold for nanoimprint having a constitution different from that in Embodiment 1 and a production process of a nanostructure using the mold according to the present invention will be described.

In this embodiment, as a substrate for preparing a mold, 1.2 mm-thick quartz substrate having a 10 mm square is used.

At the surface of the quartz substrate, a 20 nm-thick layer (film) of Al is formed by sputtering and thereon, a 30 nm-thick resist for electron beam lithography is formed by spin coating.

In a 5 mm square area, a pattern including a constant-pitch circular clear portion pattern having a pitch of 160 nm and a diameter of 80 nm is formed by light exposure and development.

Thereafter, by dry etching, circular clear portions having a pitch of 160 nm and a diameter of 80 nm are formed in the Al layer.

Then, by using the Al layers an etching mask, a recess structure having a pitch of 160 nm, a diameter of 80 nm, and a depth of 20 nm is formed by dry etching in the 5 mm square area at the surface of the quartz substrate.

Figure 7:
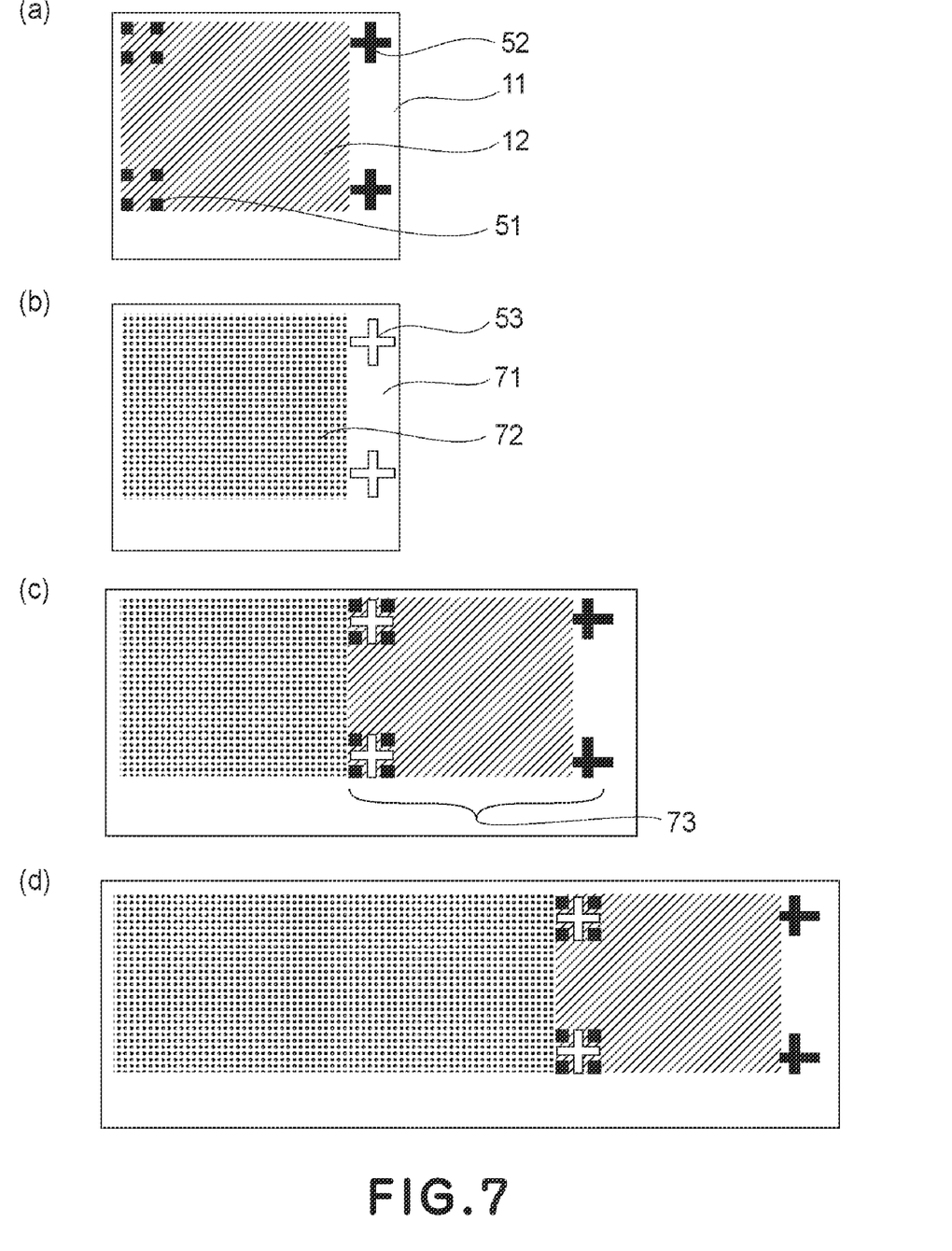
FIGS. 7(a) to 7(d) are schematic views for illustrating a production process of a mold for nanoimprint in Embodiment 2 of the present invention and a production process of a nanostructure using the mold.

Next, formation of an alignment mark as shown in FIG. 7(a) is effected.

In FIG. 7(a), a mold-side alignment mark 51 consisting of four rectangles (squares) corresponds to the pattern B2 described above and a cross pattern 52 for forming an alignment mark corresponds to the pattern B1 described above.

At the surface of the quartz substrate subjected to pattern formation, the resist for electron beam lithography is formed again in a thickness of 100 nm by spin coating.

Next, patterning is effected by light exposure and development to effect masking only at a portion corresponding to the cross pattern 52 shown in FIG. 7(a). Thereafter, the quartz substrate is subjected to dry etching.

In this embodiment, the cross pattern includes a combination of rectangles each having a long side of 500 μm and a short side of 200 μm.

Then, the resist for electron beam lithography is coated again at the quartz substrate surface and subjected to light exposure and development to effect masking at a portion other than the portion corresponding to the mold-side alignment mark 51 shown in FIG. 7(a), followed by dry etching of the quartz substrate. Here, the mold-side alignment mark 51 include four 200 μm-square rectangles disposed at four corner portions in a 500 μm square area.

As a result, in a pattern area 12, a recess structure having a pitch of 160 nm, a diameter 80 nm, and a depth of 50 nm is formed. Further, at a portion of the mold-side alignment mark 51 shown in FIG. 7(a), a recess structure having a pitch of 160 nm, a diameter of 80 nm, and a depth of 80 nm is formed. Further, at a portion of the cross pattern 52 for forming the alignment mark, a recess structure having a pitch of 160 nm, a diameter of 80 nm, and a depth of 20 nm is formed.

By using the thus prepared mold, constant-pitch alumina holes and formed in an Al (thin film) layer formed at a surface of an Si substrate in the following manner.

On a 4-inch Si wafer, after a 5 nm-thick Ti layer and a 200 nm-Al layer are successively formed by sputtering, a 100 nm-thick resist for electron beam lithography is formed by spin coating.

Thereafter, nanoimprint(ing) is effected with respect to the substrate by using the above prepared mold with the alignment mark under a condition of 150° C. and 500 kgf/cm$^2$.

As a result, at the surface of the substrate, a fine pattern is formed in a 5 mm square area (FIG. 7(b)).

Next, as shown in FIG. 7(b), a cross pattern 53 formed on the surface of the resist for electron beam lithography by pressing and the mold-side alignment mark 51 are aligned with each other by overlapping each other, followed by pressing. In this case, irrespective of whether or not the cross pattern 53 is formed on the substrate in advance, the pattern corresponding to the pattern A formed at the mold surface is formed at the substrate surface and the cross pattern 53 formed on the substrate disappears by the pressing.

By repeating the alignment and pressing described above (FIG. 7(d)), a fine (minute) pattern is formed in an area of 5 mm×9 mm. By repeating such an operation, the fine pattern is formed in a 50 mm square area.

Then, dry etching is effected in a mixture gas of BCl$_3$ and O$_2$, a part of the Al layer in a recess portion formed by the pressing is removed.

After the resist is removed by ashing, acidic oxidation is effected in a 0.3 mol-aqueous solution of a mixture of oxalic acid and phosphoric acid (1:1) by applying a voltage of 64V at 16° C.

When the thus prepared film by the anodic oxidization is observed through a field emission scanning electron microscope (FE-SEM), nanoholes having a diameter of 35 nm are formed with a (constant) pitch of 160 nm in a triangular lattice shape in a direction perpendicular to the substrate surface.

Embodiment 3

In Embodiment 3 a production process of a quartz-mode mold for nanoimprint having a constitution different from those in Embodiments 1 and 2 and a production process of a nanostructure using the mold according to the present invention will be described.

In this embodiment, as a substrate for preparing a mold, a 2 inch wafer is used and on its surface, a 5 nm-thick Ti layer and a 100 nm-thick Al layer are formed by sputtering and thereon, a 30 nm-thick resist for electron beam lithography is formed by spin coating.

In a 5 mm square area, a pattern including a constant-pitch circular clear portions pattern having a pitch of 100 nm and a diameter of 30 nm is formed by light exposure and development.

Thereafter, by dry etching, circular clear portions having a pitch of 100 nm and a diameter of 30 nm are formed in the Al layer.

Then, dry etching is effected to form a recess structure with a pitch of 100 nm.

After the resist is removed by ashing, acidic oxidation is effected in a 0.3 mol-aqueous solution of oxalic acid by applying a voltage of 64V at 16° C., followed by pore enlargement treatment by dipping the substrate (wafer) in a 0.3 M aqueous solution of phosphoric acid for 30 minutes.

When the thus prepared film by the anodic oxidization is observed through an FE-SEM, nanoholes having a diameter of 35 nm are formed with a (constant) pitch of 100 nm in a triangular lattice shape in a direction perpendicular to the substrate surface.

Then, the nanoholes are filled with a plating material by AC plating using a nickel sulfamate bath (500 g/l of sulfamic acid, 30 g/l of boric acid, 1.5 ml/l of a surfactant, pH=3.5, 50° C.) and an excessive portion of the plating material is removed by polishing.

Thereafter, at the surface of the substrate, a 100 nm-thick resist for electron beam lithography is formed by spin coating, followed by light exposure and development to form a 500 μm square opening pattern at each of four corner portions of the nanohole formed area.

Then, the substrate is dipped in a sulfuric acid to remove a part of the anodic-oxidized film only at the opening pattern portion of the resist.

Then, the resist is removed and the above described nickel plating is effected at the substrate surface and thereafter the plating member is removed.

When the thus prepared plating member is observed through the FE-SEM, a projection structure having a pitch of 100 nm, a diameter of 35 nm, and a height of 100 nm in a 5 mm square area and a sub-pattern having a pitch of 100 nm, a diameter of 35 nm, and a height of 50 nm in a 500 μm square area at each of four corner portions are observed.

By using the thus prepared mold, when the FE-SEM observation is performed in the same manner as in Embodiment 1 by effecting nanoimprint while effecting alignment, it is possible to confirm that a pattern is formed in the 5 mm square area.

As described above, according to the present invention, it is possible to easily produce a structure usable as a mold for nanoimprint with an alignment mark.

Further, by repetitively effecting nanoimprint using the mold, it is possible to form a constant-pitch pattern on a substrate having a larger area than the mold. As a result, it is possible to realize a fine pattern forming method advantageous in terms of cost and mold preparation time.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 024180/2006 filed Feb. 1, 2006, which is hereby incorporated by reference.

What is claimed is:

1. A mold for imprint, comprising: a first pattern area comprising a first cyclic interval structure, which comprises a plurality of first recesses; and a second pattern area comprising a second cyclic interval structure, which comprises a plurality of second recesses, for being used as an alignment mark, wherein the first cyclic interval structure and the second cyclic interval structure have different depths, and wherein the first pattern area and the second pattern area have an equal cyclic interval, wherein the first cyclic interval structure and the second cyclic interval structure maintain continuity of the equal cyclic interval at a boundary between outermost surface portions of the first cyclic interval structure and the second cyclic interval structure, and wherein the equal cyclic interval is smaller than a size of the second pattern area, wherein the second pattern area is formed in two planes which are both parallel to a plane in which the first pattern area is formed, where one of the two planes is higher than the plane in which the first pattern area is formed and another of the two planes is lower than the plane in which the first pattern area is formed.

2. A mold for imprint, comprising : a first pattern having a projection and recess shape for being transferred onto a member to be processed; and a second pattern having a projection and recess shape for being used as an alignment mark, wherein the projection and recess shape of the second pattern has a height different from that of the projection and recess shape of the first pattern and has an equal cyclic interval to that of the projection and recess shape of the first pattern and wherein the equal cyclic interval is smaller than a size of the second pattern area, wherein the second pattern area is formed in two planes which are both parallel to a plane in which the first pattern area is formed, where one of the two planes is higher than the plane in which the first pattern area is formed and another of the two planes is lower than the plane in which the first pattern area is formed.

3. A mold according to claim 1, wherein at least a part of the first pattern area is arranged with a constant cyclic interval.

4. A mold according to claim 1, wherein at least a part of the first pattern area is a projection.

5. A mold according to claim 1, wherein the second pattern area is optically observable.

6. A mold according to claim 1, wherein the second pattern area is formed at a corner portion of the mold.

7. A mold according to claim 1, wherein the second pattern area includes a projection and recess pattern at a portion thereof, and wherein the projection and recess pattern has a depth smaller than that of the first pattern area.

8. A mold according to claim 1, wherein the mold comprises a light-transmissive material.

* * * * *